United States Patent
Sun et al.

(10) Patent No.: US 11,242,615 B2
(45) Date of Patent: Feb. 8, 2022

(54) GROWTH METHOD AND APPARATUS FOR PREPARING HIGH-YIELD CRYSTALS

(71) Applicant: THE 13TH RESEARCH INSTITUTE OF CHINA ELECTRONICS TECHNOLOGY GROUP CORPORATION, Hebei (CN)

(72) Inventors: Niefeng Sun, Hebei (CN); Shujie Wang, Hebei (CN); Tongnian Sun, Hebei (CN); Huisheng Liu, Hebei (CN); Huimin Shao, Hebei (CN); Yanlei Shi, Hebei (CN)

(73) Assignee: THE 13TH RESEARCH INSTITUTE OF CHINA ELECTRONICS TECHNOLOGY GROUP CORPORATION, Hebei (CN)

(*) Notice: Subject to any disclaimer, the term of this patent is extended or adjusted under 35 U.S.C. 154(b) by 226 days.

(21) Appl. No.: 16/627,934

(22) PCT Filed: Apr. 18, 2019

(86) PCT No.: PCT/CN2019/083280
§ 371 (c)(1),
(2) Date: Dec. 31, 2019

(87) PCT Pub. No.: WO2020/118998
PCT Pub. Date: Jun. 18, 2020

(65) Prior Publication Data
US 2021/0355599 A1    Nov. 18, 2021

(30) Foreign Application Priority Data

Dec. 14, 2018  (CN) .......................... 201811532438.9
Dec. 14, 2018  (CN) .......................... 201822103824.8

(51) Int. Cl.
*C30B 11/00* (2006.01)
*C30B 11/14* (2006.01)
(Continued)

(52) U.S. Cl.
CPC .......... *C30B 11/002* (2013.01); *C30B 11/003* (2013.01); *C30B 11/006* (2013.01);
(Continued)

(58) Field of Classification Search
CPC ....... C30B 11/00; C30B 29/40; C30B 11/002; C30B 15/002; C30B 15/10; C30B 35/00
See application file for complete search history.

(56) References Cited

U.S. PATENT DOCUMENTS 3,206,286 A * 9/1965 Longini .................. C30B 15/36
                                                      117/202
4,454,096 A * 6/1984 Lorenzi ................. C30B 15/005
                                                      117/202
2013/0192516 A1* 8/2013 Chen ....................... C30B 11/14
                                                      117/54

FOREIGN PATENT DOCUMENTS

CN        101824650 A  *  9/2010  ............. C30B 29/06

OTHER PUBLICATIONS

European Patent Office, English computer translation of CN101824650 A (Year: 2021).*

* cited by examiner

*Primary Examiner* — Matthew J Song
(74) *Attorney, Agent, or Firm* — Veros Legal Solutions, LLP (57) ABSTRACT

The invention provides a growth method for preparing high-yield crystals, belongs to the technical field of single crystal growth. Auxiliary crucibles are arranged on a crucible according to different crystal types and according to the crystal orientation of crystal growth in the main crucible, the
(Continued)

relationship between the crystal growth direction and twin crystal orientation. By controlling the angle between the auxiliary crucibles and the main crucible, the relative position between the auxiliary crucibles each other, the auxiliary crucibles realize correction on the crystal orientation of twins generated in the main crucible crystal growth process. The growth method for preparing the high-yield crystals provided by the invention has the following advantages: the crystal orientation change caused by twins is corrected through auxiliary crucibles additionally arranged on the main crucible, and the overall yield is improved for the growth process of the dislocation crystal with large probability; the crucible position can be customized according to the influence of twins on the crystal growth direction, suitable for various crystal preparation processes, improving the yield obviously, reducing the crystal processing difficulty, and improving the material utilization rate.

10 Claims, 7 Drawing Sheets

(51) Int. Cl.
*C30B 29/40* (2006.01)
*C30B 35/00* (2006.01)
*C30B 15/00* (2006.01)
*C30B 15/10* (2006.01)

(52) U.S. Cl.
CPC ............ *C30B 11/14* (2013.01); *C30B 15/002* (2013.01); *C30B 15/10* (2013.01); *C30B 29/40* (2013.01); *C30B 35/002* (2013.01)

GROWTH METHOD AND APPARATUS FOR PREPARING HIGH-YIELD CRYSTALS

TECHNICAL FIELD

The invention relates to the technical field of compound semiconductor single crystal growth, and in particular to a growth method and an apparatus for preparing high-yield crystals.

BACKGROUND ART

Vertical Gradient Freeze (VGF) is a preferred method for preparing high quality InP crystals generally comprising the following growth steps: putting the synthesized compound semiconductor polycrystalline material, a seed crystal, a sealing agent and the like into a crucible and sealing the crucible in a vacuumized furnace body, melting the polycrystalline material and the seed crystal through temperature gradient control, and slowly growing a single crystal from the seed crystal end upwards. In actual crystal production, orderly and precise control of procedures, such as heating materials, temperature maintenance, and slowly cooling, is required. Due to the apparatus, control and transmission, convection, radiation, etc., the thermal field is extremely complicated and the control is difficult. Especially, for the growth process of single crystals such as indium phosphide, its high dissociation pressure requires a high-temperature and high-pressure growth environment, and its low stacking fault energy is very prone to twin defects; further, its critical shear stress is small, making the preparation of high-quality indium phosphide crystals very difficult. Due to the high probability of twinning, the yield is low, and the cost is high, restricting its wide application in the fields of optical fiber communication, microelectronics and solar energy.

Improving crystal growth yield is a hot and difficult point in the field of single crystal growth. The invention patent 201410293610.5 discloses a process for growing high-quality compound semiconductor single crystal by R-VGF method. Based on the growth process of single crystal by VGF method, a rotating process is added to obtain a uniformly distributed radial temperature field, beneficial to the effective heat dissipation of the axial temperature field. The process mainly aims to obtain a temperature field environment suitable for high-quality single crystal growth, but in practical application. due to the fact that a plurality of thermocouples of each hot area are monitored, the circuit is complex, on the other hand, due to rotation, the probability of the positions of the crucible, the furnace body and the like deviating from neutrality increases, leading to a reduced yield, and poor product consistency. Therefore, it is an urgent technical problem to be solved in the art to develop a single crystal growth method and a mated apparatus with good stability and high yield.

SUMMARY OF THE INVENTION

In order to solve the technical problems of low single crystal growth yield and high cost of the existing VGF method, the invention provides a growth method and an apparatus for preparing high-yield crystals, which adopt the technical scheme that an auxiliary crucibles are additionally arranged on a main crucible so as to correct the crystal orientation change caused by twins, so that the overall crystal growth yield is improved with low processing difficulty, and good stability.

The technical scheme adopted by the invention is as follows: a growth method for preparing high-yield crystals by a crystal growth crucible and a mated heating furnace. The crystal growth crucible, in a structure, comprises a main crucible sequentially provided with a seed crystal portion, a growth portion, a necking portion and a feeding growth portion from bottom to top, and auxiliary crucibles dispersed on the necking portion of the main crucible; the method sequentially comprises steps of feeding materials, vacuumizing, melting materials in the main crucible, melting materials in the auxiliary crucibles, cooling the main crucible, cooling the auxiliary crucibles successively and disassembling the furnace to remove a crystal ingot; the step of feeding materials comprises putting a seed crystal into the seed crystal portion according to a crystal plane index ($h_1$ $k_1$ $l_1$) perpendicular to a crystal growth direction; feeding a polycrystalline crushed material into the growth portion, the feeding growth portion of the main crucible and the auxiliary crucibles respectively, and then feeding a sealant; and controlling an included angle between center lines of auxiliary crucible and the main crucible (6) to be θ, and an included angle between center lines of the auxiliary crucibles to be φ or a multiple of φ, with θ and φ being satisfied $$\cos\theta = |(h_1h_2+k_1k_2+l_1l_2)|/[(h_1^2+l_1^2+k_1^2)(h_2^2+l_2^2+k_2^2)]^{0.5},$$

$$\cos\varphi = |(h_3h_4+k_3k_4+l_3l_4)|/[(h_3^2+l_3^2+k_3^2)(h_4^2+l_4^2+k_4^2)]^{0.5}$$

wherein ($h_1$ $k_1$ $l_1$) is the crystal plane index perpendicular to the crystal growth direction; after twins are generated, the crystal plane perpendicular to the crystal ingot along the crystal growth direction is converted into ($h_2$ $k_2$ $l_2$); ($h_3$ $k_3$ $l_3$) and ($h_4$ $k_4$ $l_4$) are crystal plane indices perpendicular to the crystal growth crystal plane and passing through twin lines on adjacent crystal growth crystal planes.

Further, the auxiliary crucible, in a structure, comprises, a connection portion connected to the necking portion of the main crucible, a branch growth portion and a balance tube sequentially from bottom to top, a top end of the balance tube being higher than the necking portion of the crystal growth crucible.

Furthermore, the method specifically comprises the following steps:

① feeding materials: putting the seed crystal into the seed crystal portion according to the crystal plane index perpendicular to the crystal growth direction, putting the polycrystalline crushed material into growth portion, the feeding growth portion of the main crucible and the auxiliary crucible, respectively, and then putting the sealant;

② vacuumizing; vacuumizing a furnace body, and filling inert gas to 1.8-2.5 MPa;

③ melting materials in the main crucible: allowing, by means of a heating assembly and thermometric couples of the main crucible, the main crucible to form a temperature gradient sequentially increased from bottom to top, and controlling the temperature at the seed crystal portion to be lower than a melting point of the crystal to enable the polycrystalline material in the main crucible to melt;

④ melting materials in the auxiliary crucibles: controlling, by means of heating assemblies and thermometric couples mated for each auxiliary crucible, the temperature of each auxiliary crucible to rise from bottom to top sequentially, thereby forming a temperature gradient in each auxiliary crucible from bottom to top to melt polycrystalline materials in the auxiliary crucibles;

⑤ cooling the main crucible: controlling, by means of the heating assembly and the thermometric couples of the main crucible, the main crucible to form a temperature gradient sequentially reduced from bottom to top, and controlling the temperature at the seed crystal portion to be lower than the melting point of the crystal;

⑥ cooling the auxiliary crucibles sequentially: controlling each auxiliary crucible to cool from bottom to top sequentially, and controlling the auxiliary crucible to form a temperature gradient reduced from bottom to top sequentially when a temperature at a joint of auxiliary crucible and the main crucible is lower than the melting point of the crystal, and allowing the melting point isotherms of the crystal in auxiliary crucibles same as that in the main crucible; and ⑦ controlling the heating assembly to slowly cool the main crucible and the auxiliary crucible to room temperature when the temperature at the balance tube of each auxiliary crucible is lower than the melting point of the crystal, and disassembling the furnace to remove the crystal ingot.

The invention also provides a high-yield crystal growth crucible comprising a main crucible, wherein the main crucible, in a structure, comprises a main crucible seed crystal portion and a main crucible growth portion from bottom to top sequentially, and auxiliary crucibles are arranged on the main crucible along a circumferential direction.

Furthermore, an included angle between center lines of auxiliary crucible and the main crucible (6) is θ, cos θ=| $(h_1h_2+k_1k_2+l_1l_2)$|/[$(h_1^2+l_1^2+k_1^2)$ $(h_2^2+l_2^2+k_2^2)$]$^{0.5}$, wherein $h_1$ $k_1$ $l_1$ $h_2$ $k_2$ $l_2$ are crystal plane indices, a crystal plane perpendicular to a crystal growth direction is ($h_1$ $k_1$ $l_1$); and the crystal plane perpendicular to the ingot in the direction of crystal growth is converted to ($h_2$ $k_2$ $l_2$) after twins are generated.

Further, the main crucible comprises a seed crystal portion, a growth portion, a necking portion and a feeding growth portion successively from bottom to top, and the auxiliary crucible is provided at the necking portion of the main crucible; and the auxiliary crucible, in a structure, comprises a connection portion connected with the necking portion of the main crucible, a branch growth portion and a balance tube from bottom to top sequentially, wherein a top end of the balance tube is higher than the necking portion of the main crucible.

Further, an included angle between center lines of the auxiliary crucibles is φ or a multiple of φ, cos φ=|$(h_3h_4+k_3k_4+l_3l_4)$|/[$(h_3^2+l_3^2+k_3^2)$ $(h_4^2+l_4^2+k_4^2)$]$^{0.5}$, wherein ($h_3$ $k_3$ $l_3$) and ($h_4$ $k_4$ $l_4$) are crystal plane indices perpendicular to the crystal growth crystal plane and passing through twin lines on adjacent crystal growth crystal planes. A growth method for preparing a high-yield InP crystal comprises the following steps:

① feeding materials: putting the seed crystal into the seed crystal portion according to the crystal plane index ($h_1$ $k_1$ $l_1$) perpendicular to the crystal growth direction, putting the polycrystalline crushed material into growth portion, the feeding growth portion of the main crucible and the auxiliary crucible, respectively, and then putting the sealant;

② vacuumizing; vacuumizing a furnace body, and filling inert gas to 1.8-2.5 MPa;

③ melting materials in the main crucible: allowing, by means of a heating assembly and thermometric couples of the main crucible, the main crucible to form a temperature gradient sequentially increased from bottom to top, and controlling the temperature at the seed crystal portion to be lower than 1060-1065° C. to enable the polycrystalline material in the main crucible to melt;

④ melting materials in the auxiliary crucibles: controlling, by means of heating assemblies and thermometric couples mated for each auxiliary crucible, the temperature of each auxiliary crucible to rise from bottom to top sequentially, thereby forming a temperature gradient in each auxiliary crucible from bottom to top to melt polycrystalline materials in the auxiliary crucibles;

⑤ cooling the main crucible: controlling, by means of the heating assembly and the thermometric couples of the main crucible, the main crucible to form a temperature gradient sequentially reduced from bottom to top, and controlling the temperature at the seed crystal portion to be lower than 1060-1065° C.;

⑥ cooling the auxiliary crucibles sequentially: controlling each auxiliary crucible to cool from bottom to top sequentially, and controlling the auxiliary crucible to form a temperature gradient reduced from bottom to top sequentially when a temperature at a joint of auxiliary crucible and the main crucible is lower than 1060-1065° C., and allowing 1062° C. isotherms in the auxiliary crucible same as that in the main crucible; and ⑦ controlling the heating assembly to slowly cool the main crucible and the auxiliary crucible to room temperature when the temperature at the balance tube of each auxiliary crucible is lower than the melting point of the crystal, and disassembling the furnace to remove the crystal ingot.

Further, in the step of feeding materials, the seed crystal (10) is put in a crystal orientation of <100>, and the auxiliary crucible is axially parallel to the <011> crystal orientation of the seed crystal.

Further, the included angle between the center lines of the auxiliary crucibles is 90° or 180° or 360°.

Furthermore, in the step of feeding materials, the seed crystal is put in a crystal orientation of <111>, and the included angle between center lines of the auxiliary crucibles is 60° or 120°.

In the technical scheme, the invention provides a growth method for preparing high-yield crystals by a heating furnace, a crystal growth crucible and a matched control system. the crystal growth crucible, in a structure, comprises a main crucible sequentially provided with a seed crystal portion, a growth portion, a necking portion and a feeding growth portion from bottom to top, and auxiliary crucibles dispersed on the necking portion of the main crucible; the method sequentially comprises steps of feeding materials, vacuumizing, melting materials in the main crucible, melting materials in the auxiliary crucibles, cooling the main crucible, cooling the auxiliary crucibles successively and disassembling the furnace to remove a crystal ingot; the step of feeding materials comprises putting a seed crystal into the seed crystal portion according to a crystal plane index <$h_1$ $k_1$ $l_1$> perpendicular to a crystal growth direction; feeding a polycrystalline crushed material into the growth portion, the feeding growth portion of the main crucible and the auxiliary crucible respectively, and then feeding a sealant to seal polycrystalline materials during heating, wherein, the main idea of the invention for improving the crystal growth rate is that an auxiliary crucible is adopted to correct the twin orientation generated in the main crucible crystal growth process, and the included angle between auxiliary crucible and the main crucible and the relative position between the auxiliary crucibles each other are controlled according to different crystal types and according to the crystal orientation of crystal growth in the main crucible (or the crystal orientation along the crystal growth method when a seed crystal is put in), the relation between the crystal growth orientation and the twin crystal orientation; the seed crystal is put into the seed crystal portion in the main crucible according to the crystal plane index ($h_1$ $k_1$ $l_1$) perpendicular to the crystal growth direction, and polycrystalline crushed materials are put into the main crucible growth portion, the feeding growth portion and the auxiliary crucibles respectively, and followed by putting the sealants; in this case, the included angle between the center lines of auxiliary crucible and the main crucible needs to be controlled to be θ, the included angle between the center lines of the auxiliary crucibles to φ or a multiple of φ, and θ and φ satisfy the following formulas $$\cos\theta = |(h_1h_2+k_1k_2+l_1l_2)|/[(h_1^2+l_1^2+k_1^2)(h_2^2+l_2^2+k_2^2)]^{0.5},$$

$$\cos\varphi = |(h_3h_4+k_3k_4+l_3l_4)|/[(h_3^2+l_3^2+k_3^2)(h_4^2+l_4^2+k_4^2)]^{0.5}$$

to achieve the correction.

wherein, ($h_1$ $k_1$ $l_1$) is the crystal plane index perpendicular to the crystal growth direction; after twins are generated, the crystal plane perpendicular to the crystal ingot along the crystal growth direction is converted into ($h_2$ $k_2$ $l_2$); ($h_3$ $k_3$ $l_3$) and ($h_4$ $k_4$ $l_4$) are crystal plane indices perpendicular to the crystal growth crystal plane and passing through twin lines on adjacent crystal growth crystal planes.

The present invention has following beneficial effects: (1) the growth method for preparing the high-yield crystal provided by the invention, by adding the auxiliary crucible on the main crucible to change the crystal orientation change caused by twins, realizes the finished crystal added to the auxiliary crucible; and the overall yield is improved for the growth process of the dislocation crystal with large probability; and (2) the crucible position can be customized according to the influence of twins on the crystal growth direction, suitable for various crystal preparation processes, improving the yield obviously, reducing the crystal processing difficulty, and improving the material utilization rate.

wherein, 6: main crucible; 6-1: seed crystal portion; 6-2: growth portion; 6-3: necking portion; 6-4: feeding growth portion; 7: heating wire bearing layer; 8: insulating layer; 9: heating wires; 10: seed crystal; 11: thermocouple a; and 12: thermocouple b;

13-1-14: thermometric couples a-n of the main crucible, namely 13-1: thermometric couple a of the main crucible; 13-2: thermometric couple b of the main crucible; 13-3: thermometric couple c of the main crucible; 13-4: thermometric couple d of the main crucible; 13-5: thermometric couple e of the main crucible; 13-6: thermometric couple f of the main crucible; 13-7: thermometric couple g of the main crucible; 13-8: thermometric couple h of the main crucible; 13-9: thermometric couple i of the main crucible; 13-10: thermometric couple j of the main crucible; 13-11: thermometric couple k of the main crucible; 13-12: thermometric couple l of the main crucible; 13-13: thermometric couple m of the main crucible; and 13-14: thermometric couple n of the main crucible;

15: auxiliary crucible a; 15-1: growth portion of auxiliary crucible a; and 15-2: balance tube of auxiliary crucible a;

14-1-7: thermometric couples a-g of auxiliary crucible a, namely 14-1: thermometric couple a of auxiliary crucible a; 14-2: thermometric couple b of auxiliary crucible a; 14-3: thermometric couple c of auxiliary crucible a; 14-4: thermometric couple d of auxiliary crucible a; 14-5: thermometric couple e of auxiliary crucible a; 14-6: thermometric couple f of auxiliary crucible a; and 14-7: thermometric couple g of auxiliary crucible a;

16: auxiliary crucible b; 16-1: growth portion of auxiliary crucible b; and 16-2: balance tube of auxiliary crucible b;

17-1-7: thermometric couples a-g of auxiliary crucible b, namely 17-1: thermometric couple a of auxiliary crucible b; 17-2: thermometric couple b of auxiliary crucible b; 17-3: thermometric couple c of auxiliary crucible b; 17-4: thermometric couple d of auxiliary crucible b; 17-5: thermometric couple e of auxiliary crucible b; 17-6: thermometric couple f of auxiliary crucible b; and 17-7: thermometric couple g of auxiliary crucible b;

18: boron oxide;

19-1-7: thermometric couples a-g of auxiliary crucible d, namely 19-1: thermometric couple a of auxiliary crucible d; 19-2: thermometric couple b of auxiliary crucible d; 19-3: thermometric couple c of auxiliary crucible d; 19-4: thermometric couple d of auxiliary crucible d; 19-5: thermometric couple e of auxiliary crucible d; 19-6: thermometric couple f of auxiliary crucible d; and 19-7: thermometric couple g of auxiliary crucible d;

20-1-7: thermometric couple a-f of auxiliary crucible c, namely 20-1: thermometric couple a of auxiliary crucible c; 20-2: thermometric couple b of auxiliary crucible c; 20-3: thermometric couple c of auxiliary crucible c; 20-4: thermometric couple d of auxiliary crucible c; 20-5: thermometric couple e of auxiliary crucible c; and 20-6: thermometric couple f of auxiliary crucible c;

21: auxiliary crucible c; 21-1: a growth portion of auxiliary crucible c; and 21-2: a balance tube of auxiliary crucible c;

22: auxiliary crucible d; 22-1: a growth portion of auxiliary crucible d; and 22-2: a balance tube of auxiliary crucible d;

Numeral number for hot zone marks of each crucible: 1-1: main heating zone a; 1-2; main heating zone b; 1-3: main heating zone c; 1-4: main heating zone d; 1-5: main heating zone e; 1-6; main heating zone f; 1-7: main heating zone g;

1-8: main heating zone h; 1-9: main heating zone i; 1-10: main heating zone j; 1-11: main heating zone k; 1-12: main heating zone l; and 1-13; main heating zone m;

3-1: heating zone a of auxiliary crucible a; 3-2: heating zone b of auxiliary crucible a; 3-3: heating zone c of auxiliary crucible a; 3-4: heating zone d of auxiliary crucible a; and 3-5: heating zone e of auxiliary crucible a;

2-1: heating zone a of auxiliary crucible b; 2-2: heating zone b of auxiliary crucible b; 2-3: heating zone c of auxiliary crucible b; 2-4: heating zone d of auxiliary crucible b; and 2-5: heating zone e of auxiliary crucible b;

4-1: heating zone a of auxiliary crucible c; 4-2: heating zone b of auxiliary crucible c; 4-3: heating zone c of auxiliary crucible c; 4-4: heating zone d of auxiliary crucible c; and 4-5: heating zone e of auxiliary crucible c; and 5-1: heating zone a of auxiliary crucible d; 5-2: heating zone b of auxiliary crucible d; 5-3: heating zone c of auxiliary crucible d; 5-4: heating zone d of auxiliary crucible d; and 5-5: heating zone e of auxiliary crucible d.

DETAILED DESCRIPTION OF THE INVENTION

Hereinafter, a growth method and apparatus for preparing a high yield crystal provided by the present invention will be described in detail by way of specific examples, but the scope of the present invention is not limited in any way, and those skilled in the art should make improvements or similar substitutions according to technical solutions within the scope of the present invention.

Example 1

Figure 6:
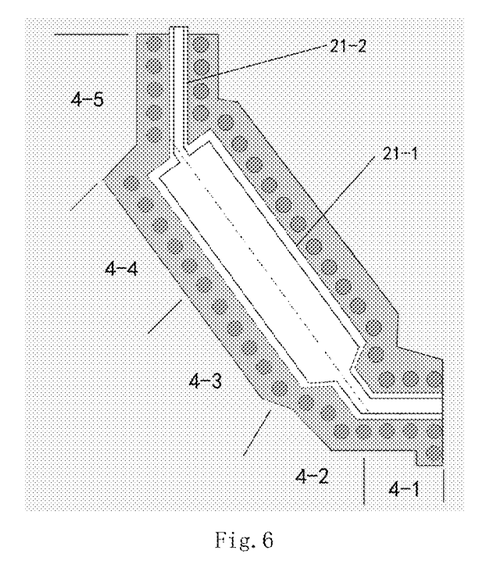
FIG. 6 is a schematic diagram showing a hot zone distribution of the heater mated with auxiliary crucible c in Example 1 of the present invention.
Figure 7:
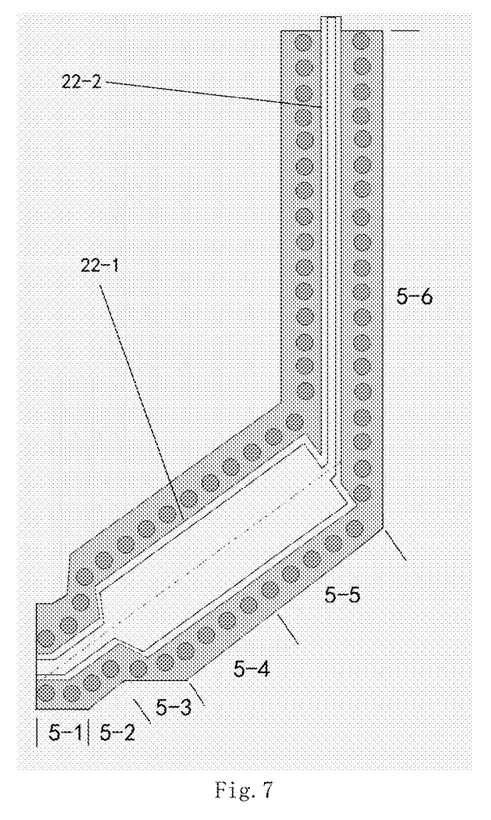
FIG. 7 is a schematic diagram showing a hot zone distribution of the heater mated with auxiliary crucible d in Example 1 of the present invention.
Figure 8:
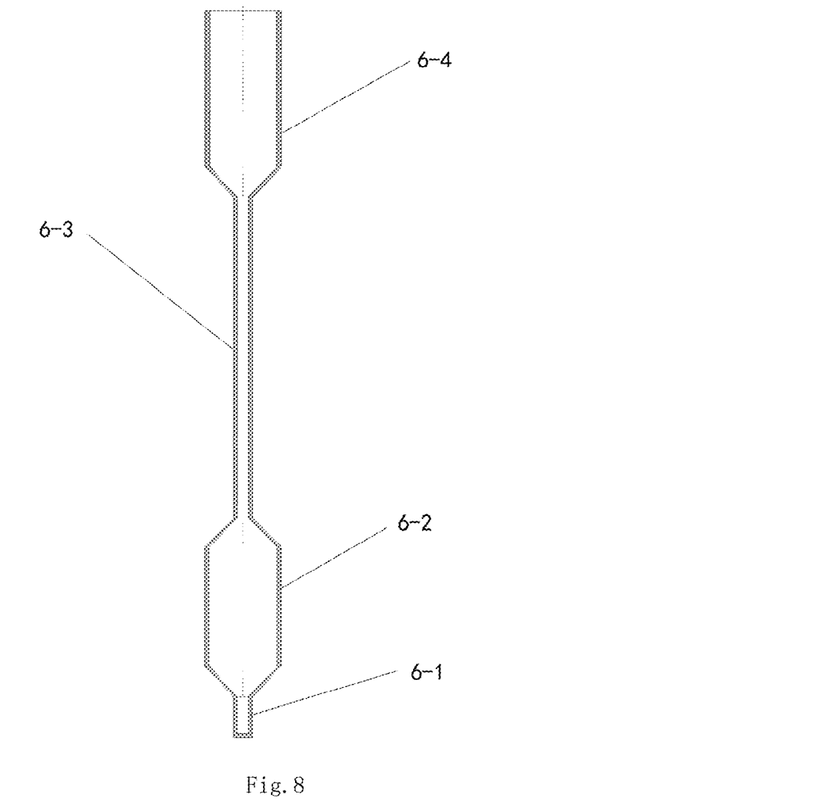
FIG. 8 is a schematic view showing a structure of the main crucible in Example 1 of the present invention.

Crystals with high yield are prepared by using a crystal growth furnace, a crucible, a mated heating assembly, a control system and the like; and the core of the method is that auxiliary crucibles are additionally arranged on a main crucible so as to correct crystal direction change caused by twins, thereby improving the overall crystal growth yield. That is, the auxiliary crucibles are additionally arranged on the main crucible, mated and arranged with the heating assembly, thermometric couples and other structures. The apparatus has a structure as follows: Referring to FIGS. 1-8, the crystal growth crucible comprises a main crucible 6 and auxiliary crucibles, which are respectively provided with mated heating assemblies and thermometric couples. The main crucible 6 has a structure as shown in FIG. 8, and comprises a seed crystal portion 6-1, a growth portion 6-2, a necking portion 6-3 and a feeding growth portion 6-4 sequentially from bottom to top. The arrangement of the necking portion 6-3 is favorable for improving the utilization rate of the crystal material and improving the growth stability of the crystal. The auxiliary crucibles are arranged on the necking portion 6-3 of the main crucibles 6 in a dendritic dispersion mode, and the relative positions of the auxiliary crucibles and the main crucibles 6 and the positions of the auxiliary crucibles are mainly determined by crystal types, relation of the crystal direction (seed crystal direction) of crystal growth in the main crucibles 6 and the twin direction. The seed crystal 10 is placed based on a crystal plane index of $(h_1\ k_1\ l_1)$ perpendicular to the crystal growth direction in the main crucibles 6; and the included angle between center lines of auxiliary crucible and the main crucible is controlled to be $\theta$, and the included angle between the center lines of the auxiliary crucibles is controlled to be $\varphi$ or a multiple of $\varphi$, and $\theta$ and $\varphi$ satisfy the following formula $$\cos\theta = |(h_1h_2+k_1k_2+l_1l_2)|/[(h_1^2+l_1^2+k_1^2)(h_2^2+l_2^2+k_2^2)]^{0.5},$$

$$\cos\varphi = |(h_3h_4+k_3k_4+l_3l_4)|/[(h_3^2+l_3^2+k_3^2)(h_4^2+l_4^2+k_4^2)]^{0.5}$$

After twins appear, the crystal plane perpendicular to a crystal ingot along the crystal growth direction is converted into $(h_2\ k_2\ l_2)$; $(h_3\ k_3\ l_3)$ and $(h_4\ k_4\ l_4)$ are crystal plane indices perpendicular to the crystal growth crystal plane and passing through twin lines on adjacent crystal growth crystal planes.

After the auxiliary crucibles are arranged according to the angles $\theta$ and $\varphi$, twins can be grown in the auxiliary crucibles according to the designed crystal orientation. The auxiliary crucibles may be provided in multiple or a plurality of layers, such as 2, 4, 8, etc., in the height direction at the necking portion of the main crucible 6.

Figure 9:
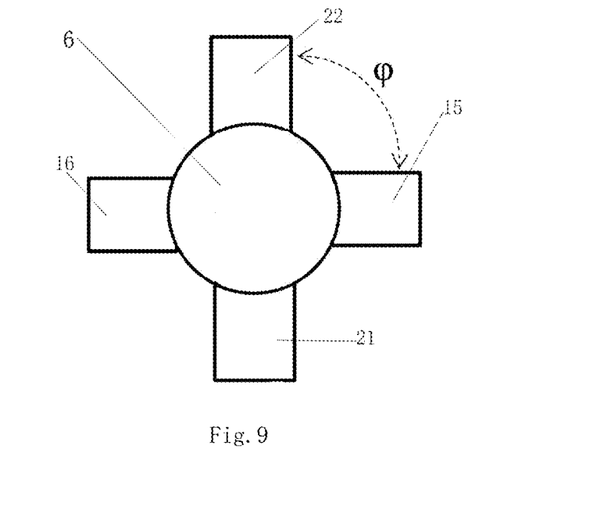
FIG. 9 is a schematic view showing the positions of the main crucible and the auxiliary crucibles when the crystal growth crucible in Example 1 of the present invention is viewed from above.

The auxiliary crucible, in a structure, preferably comprises a connection portion, a branch growth portion and a balance tube from bottom to top, wherein the top end of the balance tube is higher than the necking portion 6-3 of the crystal growth crucible 6, the connection portion and the branch growth portion are both used for growing crystals, and the balance tube can prevent gases in the branch growth portion from being discharged and forming gas holes or holes, so as to grow continuous crystals. The preparation of an InP crystal is taken as an example. During the feeding step, the seed crystal is places at a crystal direction of <100>, the InP crystal has a growth direction of <100>, twins appear at a crystal direction of <110>, the center lines of the auxiliary crucible is parallel to crystal direction <011> of the seed crystal, and <100> is 90° to <110>; the included angle between the center lines of the auxiliary crucibles is 90° or 180° or 360°, four auxiliary crucibles comprising auxiliary crucible a15, auxiliary crucible b16, auxiliary crucible c21 and auxiliary crucible d22 are arranged in the example, and the center lines of the auxiliary crucibles are arranged at 90° to each other, as can be seen from the top view of FIG. 9; the auxiliary crucible in the structure comprises a connection portion connected with the necking portion 6-3 of the main crucible 6, a branch growth portion and a balance tube from bottom to top sequentially, wherein the growth portion is used for growing crystals, and the branch growth portion is also used for growing crystals and further growing crystals meeting the crystal orientation requirements after twins appear, and the balance tube mainly prevents gases in the branch growth portion from being discharged and forming gas holes or holes. Auxiliary crucible a15 is provided with a growth portion 15-1 of auxiliary crucible a and a balance tube 15-2 of auxiliary crucible a; auxiliary crucible b is provided with a growth portion 16-1 of auxiliary crucible b and a balance tube 16-2 of auxiliary crucible b; auxiliary crucible c 21 is provided with a growth portion 21-1 of auxiliary crucible c and a balance tube 21-2 of auxiliary crucible c; auxiliary crucible d is provided with a growth portion 22-1 of auxiliary crucible d and a balance tube 22-2 of auxiliary crucible d; and the top end of the balance tube is higher than the necking portion 6-3 of the crystal growth crucible 6, as shown in FIGS. 4-7.

Figure 1:
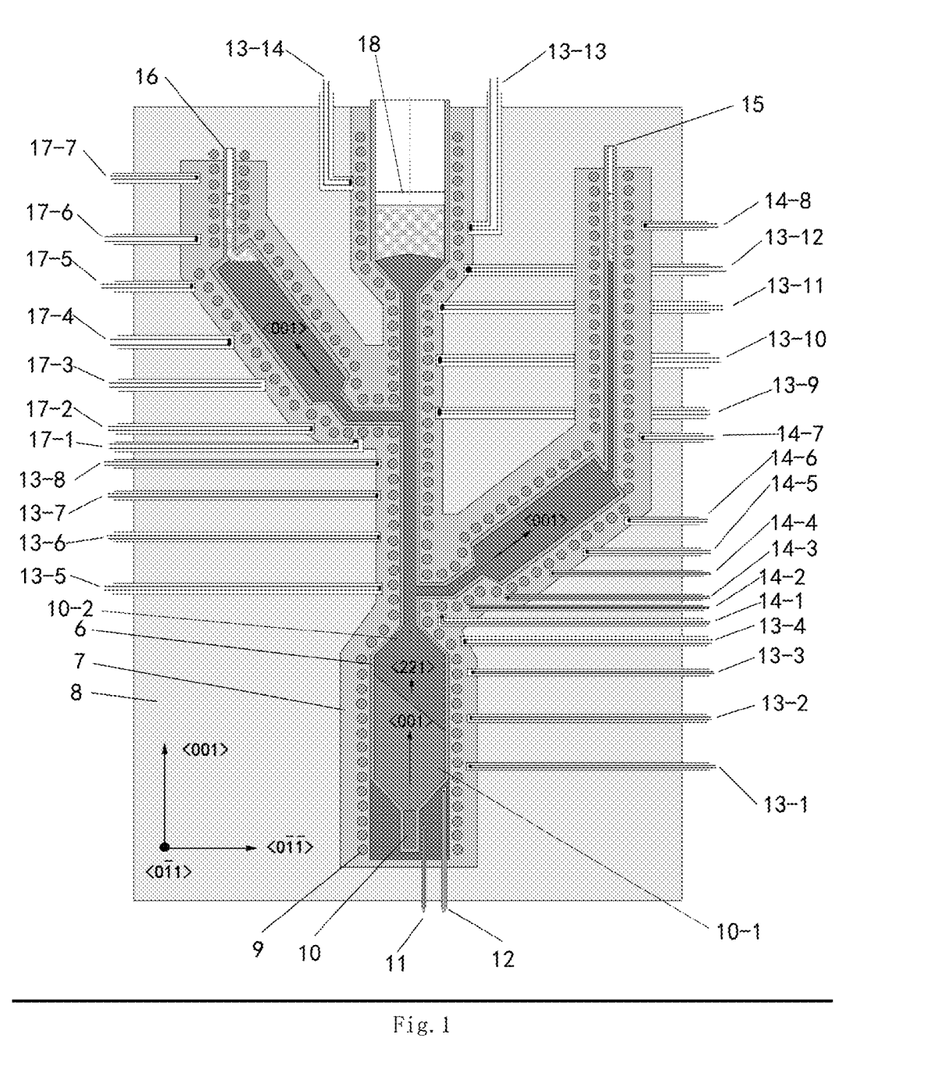
FIG. 1 is a schematic diagram showing a structure of a main crucible, an auxiliary crucible a, an auxiliary crucible b and a mated thermocouple in Example 1 of the present invention.
Figure 2:
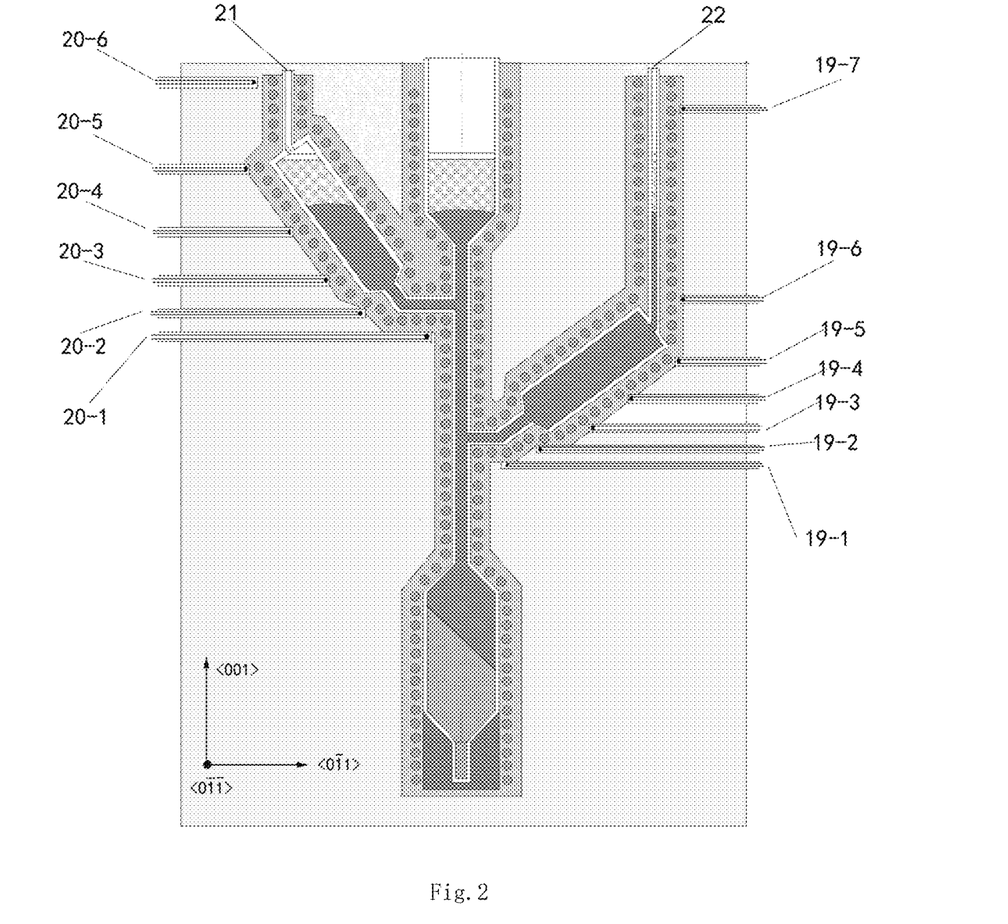
FIG. 2 is a schematic diagram showing a structure of a main crucible, an auxiliary crucible c, an auxiliary crucible d and a mated thermocouple in Example 1 of the present invention.
Figure 3:
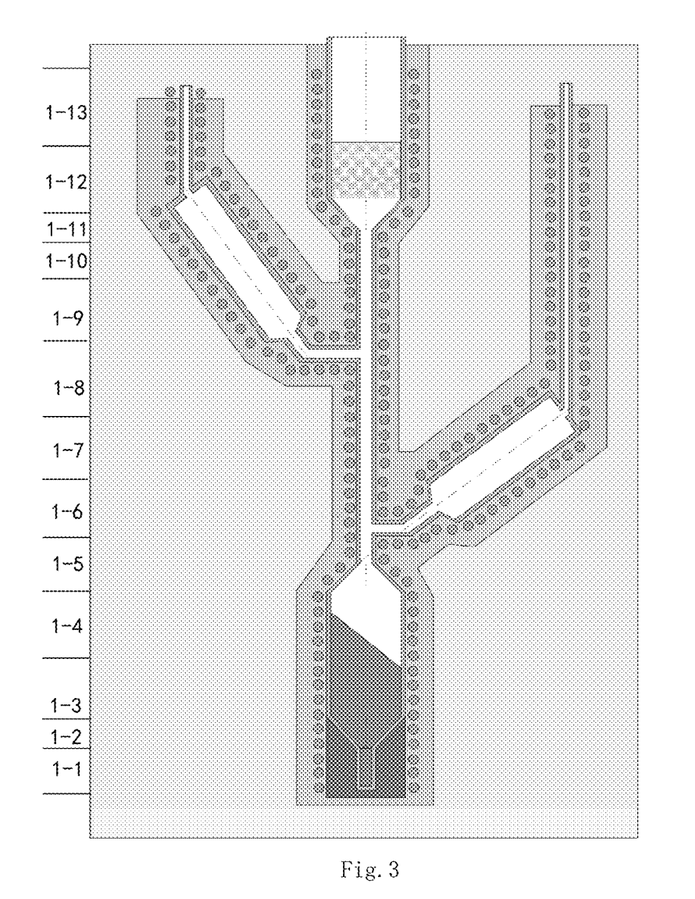
FIG. 3 is a schematic diagram showing a hot zone distribution of the heater mated with the main crucible in Example 1 of the present invention.

The main crucible 6 and auxiliary crucible are respectively provided with heating assemblies and thermometric couples at the peripheries of the crucibles, as shown in FIGS. 1-7; heating wires are arranged at the peripheries of the main crucible 6 and are divided into 13 main heating zones shown in FIG. 3 according to different heating zones, and the main heating zones a-m are respectively represented by 1-1-13; and each heating zone is provided with a thermocouple, as shown in FIG. 1, thermometric couples a-n of the main crucible by 13-1-14, respectively.

Figure 4:
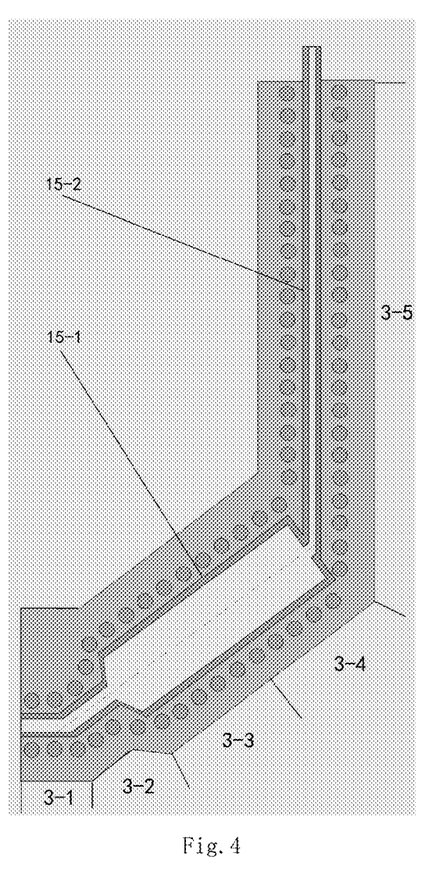
FIG. 4 is a schematic diagram showing a hot zone distribution of the heater mated with auxiliary crucible a in Example 1 of the present invention.

The heating wires arranged at the periphery of auxiliary crucible a15 are divided into five heating zones according to the zones, and the heating zones a-e of auxiliary crucible a are respectively represented by 3-1-5; and each heating zone is provided with a thermometric couple, and thermometric couples a-g of auxiliary crucible a are represented by 14-1-7, respectively.

The heating wires arranged at the periphery of auxiliary crucible d 22 are divided into five heating zones according to the zones, and the heating zones a-e of auxiliary crucible d are respectively represented by 5-1-5; and each heating zone is provided with a thermometric couple, and thermometric couples a-f of auxiliary crucible d are represented by 19-1-7, respectively.

Figure 5:
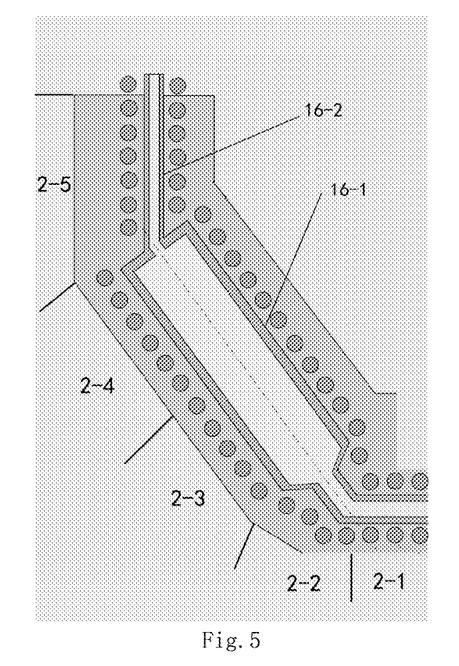
FIG. 5 is a schematic diagram showing a hot zone distribution of the heater mated with auxiliary crucible b in Example 1 of the present invention.

The heating wires arranged at the periphery of auxiliary crucible b16 are divided into five heating zones according to the zones, and the heating zones a-e of auxiliary crucible b are respectively represented by 2-1-5; and each heating zone is provided with a thermometric couple, and thermometric couples a-g of auxiliary crucible b are represented by 17-1-7, respectively.

The heating wires arranged at the periphery of auxiliary crucible c 21 are divided into five heating zones according to the zones, and the heating zones a-e of auxiliary crucible c are respectively represented by 4-1-5; and each heating zone is provided with a thermometric couple, and thermometric couples a-g of auxiliary crucible c are represented by 20-1-7, respectively.

The method for preparing the high-yield InP crystal is illustrated by taking an InP crystal synthesize as an example, and it comprises the following steps:

① feeding materials; putting a seed crystal 10 into a seed crystal portion 6-1 of the main crucible 6 according to a crystal growth crystal orientation <100>, putting polycrystalline crushed materials into a growth portion 6-2 of the main crucible 6, a feeding growth portion 6-4, auxiliary crucible a15, auxiliary crucible b16, auxiliary crucible c21 and auxiliary crucible d22 respectively through the feeding growth portion 6-4, and then adding sealants respectively; wherein the sealant used in the example is boron oxide 18, specifically, boron oxide 18 is added into the main crucible 6, balance tube 15-2 of auxiliary crucible a, balance tube 16-2 of auxiliary crucible b, balance tube 21-2 of auxiliary crucible c and balance tube 22-2 of auxiliary crucible d respectively, ensuring that the thickness of the boron oxide 18 in each crucible after melting is approximately equal;

② Vacuumizing; vacuumizing the furnace body to 10-5 Pa, and filling inert gas to 2 MPa;

③ melting materials in the main crucible 6: allowing, by means of a heating assembly and thermometric couples of the main crucible 6, the main crucible 6 to form a temperature gradient sequentially increased from bottom to top, and controlling the temperature at the seed crystal portion 6-1 to be lower than the melt point of InP (1062° C.) to enable the polycrystalline material in the main crucible 6 to melt; specifically, controlling the heating powers of the heating wires corresponding to main heating zone a1-1, main heating zone b1-2, main heating zone c1-3, main heating zone d1-4, main heating zone e1-5, main heating zone f1-6, main heating zone g1-7, main heating zone h1-8, main heating zone i1-9, main heating zone j1-10, main heating zone k1-11, main heating zones l1-12 and main heating zones m1-13, so that the temperatures of thermocouple a11, thermocouple b12, thermometric couple a13-1 of the main crucible, thermometric couple b13-2 of the main crucible, thermometric couple c13-3 of the main crucible, thermometric couple d13-4 of the main crucible and thermometric couple e13-5 of the main crucible; thermometric couple f13-6 of the main crucible, thermometric couple g13-7 of the main crucible, thermometric couple h13-8 of the main crucible; thermometric couple i13-9 of the main crucible, thermometric couple j13-10 of the main crucible, thermometric couple k13-11 of the main crucible, thermometric couple l13-12 of the main crucible, thermometric couple m13-13 of the main crucible and thermometric couple n13-14 of the main crucible are sequentially increased, and meanwhile the temperature at the thermocouple a11 is lower than 1062° C.

④ melting materials in the auxiliary crucibles: controlling, by means of heating assemblies and thermometric couples mated for each auxiliary crucible, the temperature of each auxiliary crucible to rise from bottom to top sequentially, thereby forming a temperature gradient in each auxiliary crucible from bottom to top to melt polycrystalline materials in the auxiliary crucibles; specifically, the heating control processes of the four auxiliary crucibles are as follows:

④-1 controlling the heating powers of the heating wires corresponding to heating zone a3-1 of auxiliary crucible a15, heating zone b3-2 of auxiliary crucible a, heating zone c3-3 of auxiliary crucible a, heating zone d3-4 of auxiliary crucible a, and heating zone e3-5 of auxiliary crucible a to melt the polycrystalline material in auxiliary crucible a15, so that the temperatures of thermometric couple e13-5 of the main crucible, thermometric couple a14-1 of auxiliary crucible a, thermometric couple b14-2, thermometric couple c14-3 of auxiliary crucible a, thermometric couple d14-4 of auxiliary crucible a, thermometric couple e14-5 of auxiliary crucible a, thermometric couple f14-6 of auxiliary crucible a and thermometric couple g14-7 of auxiliary crucible a are sequentially increased;

④-2 controlling the heating powers of the heating wires corresponding to heating zone a5-1 of auxiliary crucible d22, heating zone b5-2 of auxiliary crucible d, heating zone c5-3 of auxiliary crucible d, heating zone d5-4 of auxiliary crucible d, and heating zone e5-5 of auxiliary crucible d to melt the polycrystalline material in auxiliary crucible d22, so that the temperatures of thermometric couple g13-7 of the main crucible, thermometric couple a19-1 of auxiliary crucible d, thermometric couple b19-2 of auxiliary crucible d, thermometric couple c19-3 of auxiliary crucible d, thermometric couple d19-4 of auxiliary crucible d, thermometric couple e19-5 of auxiliary crucible d, thermometric couple f19-6 of auxiliary crucible d and thermometric couple g19-7 of auxiliary crucible d are sequentially increased;

④-3 then controlling the heating powers of the heating wires corresponding to heating zone a2-1 of auxiliary crucible b16, heating zone b2-2 of auxiliary crucible b, heating zone c2-3 of auxiliary crucible b, heating zone d2-4 of auxiliary crucible b, and heating zone e2-5 of auxiliary crucible b to melt the polycrystalline material in auxiliary crucible b16, so that the temperatures of thermometric couple i13-9 of the main crucible, thermometric couple a17-1 of auxiliary crucible b, thermometric couple b17-2 of auxiliary crucible b, thermometric couple c17-3 of auxiliary crucible b, thermometric couple d17-4 of auxiliary crucible b, thermometric couple e17-5 of auxiliary crucible b, thermometric couple f17-6 of auxiliary crucible b and thermometric couple g17-7 of auxiliary crucible b are sequentially increased; and ④-4 then controlling the heating powers of the heating wires corresponding to heating zone a4-1 of auxiliary crucible c, heating zone b4-2 of auxiliary crucible c, heating zone c4-3 of auxiliary crucible c, heating zone d4-4 of auxiliary crucible c, and heating zone e4-5 of auxiliary crucible c to melt the polycrystalline material in auxiliary crucible c21, so that the temperatures of thermometric couple j13-10 of the main crucible, thermometric couple a20-1 of auxiliary crucible c, thermometric couple b20-2 of auxiliary crucible c, thermometric couple c20-3 of auxiliary crucible c, thermometric couple d20-4 of auxiliary crucible c, thermometric couple e20-5 of auxiliary crucible c, thermometric couple f20-6 of auxiliary crucible c and thermometric couple g20-7 of auxiliary crucible c are sequentially increased.

⑤ cooling the material in the main crucible 6: controlling, by means of a heating assembly and thermometric couples of the main crucible 6, the main crucible 6 to form a temperature gradient sequentially decreased from bottom to top, and controlling the temperature at the seed crystal portion 6-1 to be lower than the melt point of InP; specifically, controlling the heating powers of the heating wires corresponding to main heating zone a1-1, main heating zone b1-2, main heating zone c1-3, main heating zone d1-4, main heating zone e1-5, main heating zone f1-6, main heating zone g1-7, main heating zone h1-8, main heating zone i1-9, main heating zone j1-10, main heating zone k1-11, main heating zone l1-12 and main heating zones m1-13, so that the temperatures of thermocouple a11, thermocouple b12, thermometric couple a13-1 of the main crucible, thermometric couple b13-2 of the main crucible, thermometric couple c13-3 of the main crucible, thermometric couple d13-4 of the main crucible and thermometric couple e13-5 of the main crucible; thermometric couple f13-6 of the main crucible, thermometric couple g13-7 of the main crucible, thermometric couple h13-8 of the main crucible; thermometric couple i13-9 of the main crucible, thermometric couple j13-10 of the main crucible, thermometric couple k13-11 of the main crucible, thermometric couple l13-12 of the main crucible, thermometric couple m13-13 of the main crucible and thermometric couple n13-14 of the main crucible are sequentially decreased to lower than 1062° C.

⑥ cooling the auxiliary crucibles sequentially: controlling each auxiliary crucible to cool from bottom to top sequentially, and controlling the auxiliary crucible to form a temperature gradient reduced from bottom to top sequentially when a temperature at a joint of auxiliary crucible and the main crucible 6 is lower than the melt point of InP, and allowing 1062° C. isotherms in auxiliary crucibles same as that in the main crucible (6); specifically, ⑥-1 after thermometric couple e13-5 of the main crucible is lower than 1062° C., controlling the heating powers of the heating wires corresponding to heating zone a3-1 of auxiliary crucible a, heating zone b3-2 of auxiliary crucible a, heating zone c3-3 of auxiliary crucible a, heating zone d3-4 of auxiliary crucible a, and heating zone e3-5 of auxiliary crucible a, so that the temperatures of thermometric couple a14-1 of auxiliary crucible a, thermometric couple b14-2, thermometric couple c14-3 of auxiliary crucible a, thermometric couple d14-4 of auxiliary crucible a, thermometric couple e14-5 of auxiliary crucible a, thermometric couple f14-6 of auxiliary crucible a and thermometric couple g14-7 of auxiliary crucible a are sequentially reduced; wherein the 1062° C. isotherm in auxiliary crucible a15 is controlled to be substantially the same as the 1062° C. isotherm in the main crucible 6 by monitoring the thermocouples;

⑥-2 in turn, after thermometric couple g13-7 of the main crucible is lower than 1062° C., controlling the heating powers of the heating wires corresponding to heating zone a5-1 of auxiliary crucible d22, heating zone b5-2 of auxiliary crucible d, heating zone c5-3 of auxiliary crucible d, heating zone d5-4 of auxiliary crucible d, and heating zone e5-5 of auxiliary crucible d, so that the temperatures of thermometric couple a19-1 of auxiliary crucible d, thermometric couple b19-2 of auxiliary crucible d, thermometric couple c19-3 of auxiliary crucible d, thermometric couple d19-4 of auxiliary crucible d, thermometric couple e19-5 of auxiliary crucible d, thermometric couple f19-6 of auxiliary crucible d and thermometric couple g19-7 of auxiliary crucible d are sequentially reduced; wherein the 1062° C. isotherm in auxiliary crucible d22 is guaranteed to be substantially the same as the 1062° C. isotherm in the main crucible 6 by monitoring the thermocouples;

⑥-3 in turn, after thermometric couple i13-9 of the main crucible is lower than 1062° C., controlling the heating powers of the heating wires corresponding to heating zone a2-1 of auxiliary crucible b16, heating zone b2-2 of auxiliary crucible b, heating zone c2-3 of auxiliary crucible b, heating zone d2-4 of auxiliary crucible b, and heating zone e2-5 of auxiliary crucible b, so that the temperatures of thermometric couple a17-1 of auxiliary crucible b, thermometric couple b17-2 of auxiliary crucible b, thermometric couple c17-3 of auxiliary crucible b, thermometric couple d17-4 of auxiliary crucible b, thermometric couple e17-5 of auxiliary crucible b, thermometric couple f17-6 of auxiliary crucible b and thermometric couple g17-7 of auxiliary crucible b are sequentially reduced; wherein the 1062° C. isotherm in auxiliary crucible b16 is guaranteed to be substantially the same as the 1062° C. isotherm in the main crucible 6 by monitoring the thermocouples;

⑥-4 in turn, after thermometric couple j13-10 of the main crucible is lower than 1062° C., controlling the heating powers of the heating wires corresponding to heating zone a4-1 of auxiliary crucible c, heating zone b4-2 of auxiliary crucible c, heating zone c4-3 of auxiliary crucible c, heating zone d4-4 of auxiliary crucible c, and heating zone e4-5 of auxiliary crucible c, so that the temperatures of thermometric couple a20-1 of auxiliary crucible c, thermometric couple b20-2 of auxiliary crucible c, thermometric couple c20-3 of auxiliary crucible c, thermometric couple d20-4 of auxiliary crucible c, thermometric couple e20-5 of auxiliary crucible c, thermometric couple f20-6 of auxiliary crucible c and thermometric couple g20-7 of auxiliary crucible c are sequentially reduced; wherein the 1062° C. isotherm in auxiliary crucible c21 is guaranteed to be substantially the same as the 1062° C. isotherm in the main crucible 6 by monitoring the thermocouples; and ⑦ when the temperatures at the balance tubes of each auxiliary crucible is lower than the melting point of InP, controlling heating assemblies to slowly cool the main crucible 6 and the auxiliary crucible to room temperature, and disassembling the furnace to remove crystal ingots; namely, when each of thermometric couple n13-14 of the main crucible 6, thermometric couple g14-7 of auxiliary crucible a, thermometric couple g17-7 of auxiliary crucible b, and thermometric couple f20-6 of auxiliary crucible d, and thermometric couple g19-7 of auxiliary crucible c is lower than 1062° C., slowly cooling to room temperature, disassembling the furnace to remove the crystal ingot.

Comparative Example: the structure is the same as that of the main crucible 6 in the above-mentioned Example 1, and the processes such as heating and cooling the main crucible 6 are the same as that of Example 1, except that no auxiliary crucible is provided.

By comparing the products of Example 1 and the comparative example, it is found that the yield of the InP crystals prepared in Example 1 is 32%, and that of the comparative example is about 11.4%. Many experiments have found that the yield of crystals prepared by the method of the present invention is increased to more than 30%, which is more than 3 times higher than the yield of about 10% of the current ordinary single crucible crystal growth method, with very high economic benefits. Moreover, the apparatus is simple and easy to control, suitable for industrial production.

The invention claimed is:

1. A growth method for preparing high-yield crystals by using a crystal growth crucible and a mated heating furnace, characterized in that, the crystal growth crucible, in a structure, comprises a main crucible sequentially provided with a seed crystal portion, a growth portion, a necking portion and a feeding growth portion from bottom to top, and auxiliary crucibles dispersed on the necking portion of the main crucible; the method sequentially comprises steps of feeding materials, vacuumizing, melting materials in the main crucible, melting materials in the auxiliary crucibles, cooling the main crucible, cooling the auxiliary crucibles successively and disassembling the furnace to remove a crystal ingot; the step of feeding materials comprises putting a seed crystal into the seed crystal portion according to a crystal plane index ($h_1$ $k_1$ $l_1$) perpendicular to a crystal growth direction; feeding a polycrystalline crushed material into the growth portion, the feeding growth portion of the main crucible and the auxiliary crucible respectively, and then feeding a sealant; and controlling an included angle between center lines of auxiliary crucible and the main crucible to be θ, and an included angle between center lines of the auxiliary crucibles to be φ or a multiple of φ, with θ and φ being satisfied $$\cos\vartheta = |(h_1h_2+k_1k_2+l_1l_2)|/[(h_1^2+l_1^2+k_1^2)(h_2^2+l_2^2+k_2^2)]^{0.5},$$

$$\cos\varphi = |(h_3h_4+k_3k_4+l_3l_4)|/[(h_3^2+l_3^2+k_3^2)(h_4^2+l_4^2+k_4^2)]^{0.5}$$

wherein, ($h_1$ $k_1$ $l_1$) is the crystal plane index perpendicular to the crystal growth direction; after twins are generated, the crystal plane perpendicular to the crystal ingot along the crystal growth direction is converted into ($h_2$ $k_2$ $l_2$); ($h_3$ $k_3$ $l_3$) and ($h_4$ $k_4$ $l_4$) are crystal plane indices perpendicular to the crystal growth crystal plane and passing through twin lines on adjacent crystal growth crystal planes.

2. The method of claim 1, characterized in that, the auxiliary crucible, in a structure, comprises, a connection portion connected to the necking portion of the main crucible, a branch growth portion and a balance tube sequentially from bottom to top, and a top end of the balance tube is higher than the necking portion of the crystal growth crucible.

3. The method of claim 1, characterized in that the steps are specifically as follows:
① feeding materials: putting the seed crystal into the seed crystal portion according to the crystal plane index ($h_1$ $k_1$ $l_1$) perpendicular to the crystal growth direction, putting the polycrystalline crushed material into growth portion, the feeding growth portion of the main crucible and the auxiliary crucible, respectively, and then putting the sealant;
② vacuumizing: vacuumizing a furnace body, and filling inert gas to 1.8-2.5 MPa;
③ melting materials in the main crucible: allowing, by means of a heating assembly and thermometric couples of the main crucible, the main crucible to form a temperature gradient sequentially increased from bottom to top, and controlling the temperature at the seed crystal portion to be lower than a melting point of the crystal to enable the polycrystalline material in the main crucible to melt;
④ melting materials in the auxiliary crucibles: controlling, by means of heating assemblies and thermometric couples mated for each auxiliary crucible, the temperature of each auxiliary crucible to rise from bottom to top sequentially, thereby forming a temperature gradient in each auxiliary crucible from bottom to top to melt polycrystalline materials in the auxiliary crucibles;
⑤ cooling the main crucible: controlling, by means of the heating assembly and the thermometric couples of the main crucible, the main crucible to form a temperature gradient sequentially reduced from bottom to top, and controlling the temperature at the seed crystal portion to be lower than the melting point of the crystal;
⑥ cooling the auxiliary crucibles sequentially: controlling each auxiliary crucible to cool from bottom to top sequentially, and controlling the auxiliary crucible to form a temperature gradient reduced from bottom to top sequentially when a temperature at a joint of auxiliary crucible and the main crucible is lower than the melting point of the crystal, and allowing the melting point isotherms of the crystals in auxiliary crucibles same as that in the main crucible; and
⑦ controlling the heating assembly to slowly cool the main crucible and the auxiliary crucible to room temperature when the temperature at the balance tube of each auxiliary crucible is lower than the melting point of the crystal, and disassembling the furnace to remove the crystal ingot.

4. A high-yield crystal growth crucible comprising a main crucible, characterized in that, the main crucible, in a structure, comprises a main crucible seed crystal portion and a main crucible growth portion from bottom to top sequentially, and auxiliary crucibles are arranged on the main crucible along a circumferential direction; and
further characterized in that, an included angle between center lines of auxiliary crucible and the main crucible is θ, $\cos\vartheta = |(h_1h_2+k_1k_2+l_1l_2)|/[(h_1^2+l_1^2+k_1^2)(h_2^2+l_2^2+k_2^2)]^{0.5}$, wherein $h_1$ $k_1$ $l_1$ $h_2$ $k_2$ $l_2$ are crystal plane indices, a crystal plane perpendicular to a crystal growth direction is ($h_1$ $k_1$ $l_1$); and the crystal plane perpendicular to the ingot in the direction of crystal growth is converted to ($h_2$ $k_2$ $l_2$) after twins are generated.

5. The crystal growth crucible of claim 4, characterized in that, the main crucible comprises a seed crystal portion, a growth portion, a necking portion and a feeding growth portion successively from bottom to top, and the auxiliary crucible is provided at the necking portion of the main crucible; and the auxiliary crucible, in a structure, comprises a connection portion connected with the necking portion of the main crucible, a branch growth portion and a balance tube from bottom to top sequentially, wherein a top end of the balance tube is higher than the necking portion of the main crucible.

6. The crystal growth crucible of claim 4, wherein and an included angle between center lines of the auxiliary crucibles to be φ or a multiple of φ, $\cos\varphi = |(h_3h_4+k_3 k_4+l_3l_4)|/[(h_3^2+l_3^2+k_3^2)(h_4^2+l_4^2+k_4^2)]^{0.5}$, wherein ($h_3$ $k_3$ $l_3$) and ($h_4$ $k_4$ $l_4$) are crystal plane indices perpendicular to the crystal growth crystal plane and passing through twin lines on adjacent crystal growth crystal planes.

7. A growth method for preparing a high-yield InP crystal, characterized by comprising the following steps:

① feeding materials: putting the seed crystal into the seed crystal portion according to the crystal plane index $(h_1\ k_1\ l_1)$ perpendicular to the crystal growth direction, putting the polycrystalline crushed material into growth portion, the feeding growth portion of the main crucible and the auxiliary crucible, respectively, and then putting the sealant;

② vacuumizing: vacuumizing a furnace body, and filling inert gas to 1.8-2.5 MPa;

③ melting materials in the main crucible: allowing, by means of a heating assembly and thermometric couples of the main crucible, the main crucible to form a temperature gradient sequentially increased from bottom to top, and controlling the temperature at the seed crystal portion to be lower than 1060-1065° C. to enable the polycrystalline material in the main crucible to melt;

④ melting materials in the auxiliary crucibles: controlling, by means of heating assemblies and thermometric couples mated for each auxiliary crucible, the temperature of each auxiliary crucible to rise from bottom to top sequentially, thereby forming a temperature gradient in each auxiliary crucible from bottom to top to melt polycrystalline materials in the auxiliary crucibles;

⑤ cooling the main crucible: controlling, by means of the heating assembly and the thermometric couples of the main crucible, the main crucible to form a temperature gradient sequentially reduced from bottom to top, and controlling the temperature at the seed crystal portion to be lower than 1060-1065° C.;

⑥ cooling the auxiliary crucibles sequentially: controlling each auxiliary crucible to cool from bottom to top sequentially, and controlling the auxiliary crucible to form a temperature gradient reduced from bottom to top sequentially when a temperature at a joint of auxiliary crucible and the main crucible is lower than 1060-1065° C., and allowing 1062° C. isotherms in auxiliary crucibles the same as that in the main crucible; and ⑦ controlling the heating assembly to slowly cool the main crucible and the auxiliary crucible to room temperature when the temperature at the balance tube of each auxiliary crucible is lower than the melting point of the crystal, and disassembling the furnace to remove the crystal ingot.

8. The growth method of claim 7, characterized in that, in the step of feeding materials, the seed crystal is put in a crystal orientation of <100>, and the auxiliary crucible is axially parallel to the <011> crystal orientation of the seed crystal.

9. The growth method of claim 8, wherein an included angle between center lines of the auxiliary crucibles is 90° or 180° or 360°.

10. The growth method of claim 7, characterized in that, in the step of feeding materials, the seed crystal is put in a crystal orientation of <111>, and the included angle between center lines of the auxiliary crucibles is 60° or 120°.

* * * * *